US006466203B2

(12) United States Patent
Van Ee

(10) Patent No.: US 6,466,203 B2
(45) Date of Patent: *Oct. 15, 2002

(54) HAND-HELD WITH AUTO-ZOOM FOR GRAPHICAL DISPLAY OF WEB PAGE

(75) Inventor: Jan Van Ee, San Jose, CA (US)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/619,426

(22) Filed: Jul. 19, 2000

(65) Prior Publication Data

US 2002/0030699 A1 Mar. 14, 2002

Related U.S. Application Data

(63) Continuation-in-part of application No. 09/062,364, filed on Apr. 17, 1998.

(51) Int. Cl.[7] ................................................ G09G 5/00
(52) U.S. Cl. .................................... 345/173; 345/835
(58) Field of Search ............................... 345/169, 172, 345/173, 179, 348, 666, 864, 698, 783, 784, 670, 671, 156, 157, 835

(56) References Cited

U.S. PATENT DOCUMENTS

| | | | | |
|---|---|---|---|---|
| 5,406,307 A | * | 4/1995 | Hirayama et al. | 345/120 |
| 5,596,346 A | * | 1/1997 | Leone et al. | 345/127 |
| 5,854,624 A | * | 12/1998 | Grant | 345/169 |
| 5,969,706 A | * | 10/1999 | Tanimoto et al. | 345/130 |
| 6,104,334 A | * | 4/2000 | Allport | 341/175 |
| 6,211,856 B1 | * | 4/2001 | Choi et al. | 345/666 |

* cited by examiner

Primary Examiner—Bipin Shalwala
Assistant Examiner—Mansour M. Said
(74) Attorney, Agent, or Firm—Jeroen Heuvelman

(57) ABSTRACT

A mobile phone has a display with a touch screen. The device has a browser and is capable of retrieving a Web page from the Internet. The page is first displayed in its entirety. The user can recognize the page's general lay-out and presence of hyperlinks. When the user touches a particular location on the touch screen that corresponds to a portion of the page's image, the portion gets displayed so as to fill the display's area. Thus, the user can browse the Web with a display of limited size.

6 Claims, 1 Drawing Sheet

HAND-HELD WITH AUTO-ZOOM FOR GRAPHICAL DISPLAY OF WEB PAGE

RELATED APPLICATION

This application is a continuation-in-part under 37 C.F.R. §1.53(b).2 of co-pending U.S. Ser. No. 09/062,364 filed Apr. 17, 1198 for Sung Choi and Jan van Ee for GRAPHICAL USER INTERFACE TOUCH SCREEN WITH AUTO ZOOM FEATURE.

FIELD OF THE INVENTION

The invention relates to graphical user interfaces (GUI), in particular to GUI's for devices with a relatively small screen real estate, such as handheld information appliances (palmtops, mobile phones, Web pads, PDA's or notebook computers, etc.)

BACKGROUND ART

Current trends indicate that by 2002 there will be 1B subscribers worldwide to mobile phones. By 2004 there will be more Mobile phones in use than PC's. Mobile phones have become personal, trusted devices. Mobile phones, such a the Genie manufactured by Philips Electronics, typically have an LCD as part of the user interface and there is a trend to provide an ever larger number of onboard software services.

Hand-held computing devices, such as personal digital assistants (PDA), e.g., the PalmIIIx manufactured by 3COM or a Windows CE-based handheld, can be connected to the Internet via a wireless modem. As a result, ubiquitous information access via the Internet has started to become reality. Examples of a wireless modems are, for example, the Minstrel marketed by Novatel Wireless, and the Ricochet from Metricom. The Minstrel is a two-way wireless modem for a PDA that lets the user browse the Web and receive email, among other things. In a more general sense, a wireless modem like the Minstrel or Ricochet provides the handheld device with an IP address that can be used by any type of application that uses the Internet for communication (within limitations of throughput, latency and coverage). The Minstrel uses a technology referred to as Cellular Digital Packet Data (CDPD) that is supported by the cellular service providers. Web surfing is limited to a CDPD speed cap of 19.2-kbps. The Ricochet has a faster connect rate, in the 28.8K-bps range, but it is supported in only three metropolitan centers (the San Francisco Bay area, Seattle and Wash.).

Studies further indicate that the functionalities of PDA's and mobile phones have started to converge, and that a mobile information society is developing. There will be an emerging of dedicated devices. PDA's are now work-related. In the near future PDA's will be personalized computers that stay with the user all the time. PDA's will get more power and smaller size and accommodate more, and more versatile, functionalities.

Bandwidth and display size are believed to be the factors that limit the usability and practicality of the handheld device, be it a mobile phone, a palmtop or a hybrid. In particular, the GUI and the services accessible to such handhelds are critical factors for the consumers' acceptability of such services. In particular, e-commerce or electronic shopping may benefit from the ubiquity of handhelds if the implementing technology addresses the consumers' needs in terms of user-friendliness of the handheld devices.

SUMMARY OF THE INVENTION

Co-pending U.S. Ser. No. 09/062,364 (PHA 23,387) mentioned above and incorporated herein by reference, corresponds to published International Application WO9954807. This document relates to a graphical user interface touch screen for displaying controllable functions of an electronic device. The function is displayed as an icon and at a scale size in which the function is recognizable by a user but too small to easily access features of the function. A magnified version of at least an area of the icon is provided upon the user touching the area of the icon. For example, the device has a Virtual alphanumeric keyboard. The softkeys displayed are too small for the user to select an individual one of them. Now, when the user touches the keyboard in a specific section that accommodates the desired key, the device's GUI magnifies that specific section so that the intended key re-appears at a larger scale and can be selected.

The inventor has realized that this feature, referred to as "auto-zoom", is not only useful within the context of a user-interface for control functionalities represented graphically by icons. The auto-zoom is also relevant to the rendering of any kind of graphical information on a display too small for the total information content, given the display's resolution and size. For example, handheld information processing devices with Internet access (browsers) and displays, such as PDA's, palmtops, web pads, mobile phones using, e.g., the WAP (wireless application protocol) technology, etc., can be given browsers for retrieving and navigating web pages from the Internet, but they cannot render a page in its entirety without losing information. The lay-out and general appearance of the image of the page, however, indicate whether portions may or may not be of interest to the user, e.g., as containing hyperlinks.

Such handheld devices provided with the auto-zoom feature let the user retrieve graphical information, e.g., a web page or streamed video that is stored, e.g., as a bitmap, in the display's framebuffer or another cache.

Accordingly, the invention relates to an information processing apparatus that has an input for receiving data from an external resource, e.g. the Internet, a display, and a data processing system. The system is connected to the input and to the display. The system processes the data upon receipt and renders on the display an image corresponding to the data received. The apparatus has a touch screen for enabling a user to interact with the apparatus. The system is operative to enable the user to select via the touch screen a portion of the image when displayed at a first scale. Upon the portion being selected the system renders the selected portion on the display at a second scale larger than the first scale (zoom-in). The portion selected corresponds to a location on the touch screen. The invention thus allows the user to perceive the graphical information of the image regardless of the display size. The invention is especially interesting to handhelds, such as PDA's, palmtops,. mobile phones, web pads (thin clients with browsing capabilities), etc., because the size of a handheld's display is necessarily small due to the required form factor and weight limitation. The ubiquitous information access via a browser is a great asset for Internet-enabled handhelds (comprising a wireless modem), as not only text pages but also, e.g., still pictures (e.g., jpeg), streaming video, web page with hyperlinks (e.g., HTML) and java animation are now within reach of these devices whose screen real estate needs not be the limiting factor anymore.

The apparatus in the invention can have one or more zoom levels.

The term "texting" is currently being used to refer to the sending and receiving of short text messages using mobile phones. Many service providers allow users to key in and send short text messages (SMS: short messaging service).

Teenagers in Europe and East Asia seem to have embraced this technology, just as young people in the U.S. have gone for live chat and instant messaging on the Internet. The invention in U.S. Ser. No. 09/062,364 (PHA 23,387) improves the user-friendliness of the mobile phone's GUI. The invention of the auto-zoom extended to cover the rendering of arbitrary graphical information further broadens the scope of applicability of data processing handhelds, especially in the field of consumer electronics (CE).

Screenphones may also benefit from the current invention. A screenphone is typically a wired terminal that has a small display monitor and a keyboard. The Internet screenphone market is expanding rapidly. Analysts predict revenues in this market segment as over $2 B by 2002. The success of the Minitel system in France has triggered the introduction of screenphones elsewhere by banks to promote home banking and shopping.

BRIEF DESCRIPTION OF THE DRAWING

The invention is explained below in further detail, by way of example and with reference to the accompanying drawing with a block diagram of a handheld device in the invention.

DETAILED EMBODIMENTS

Figure 1:
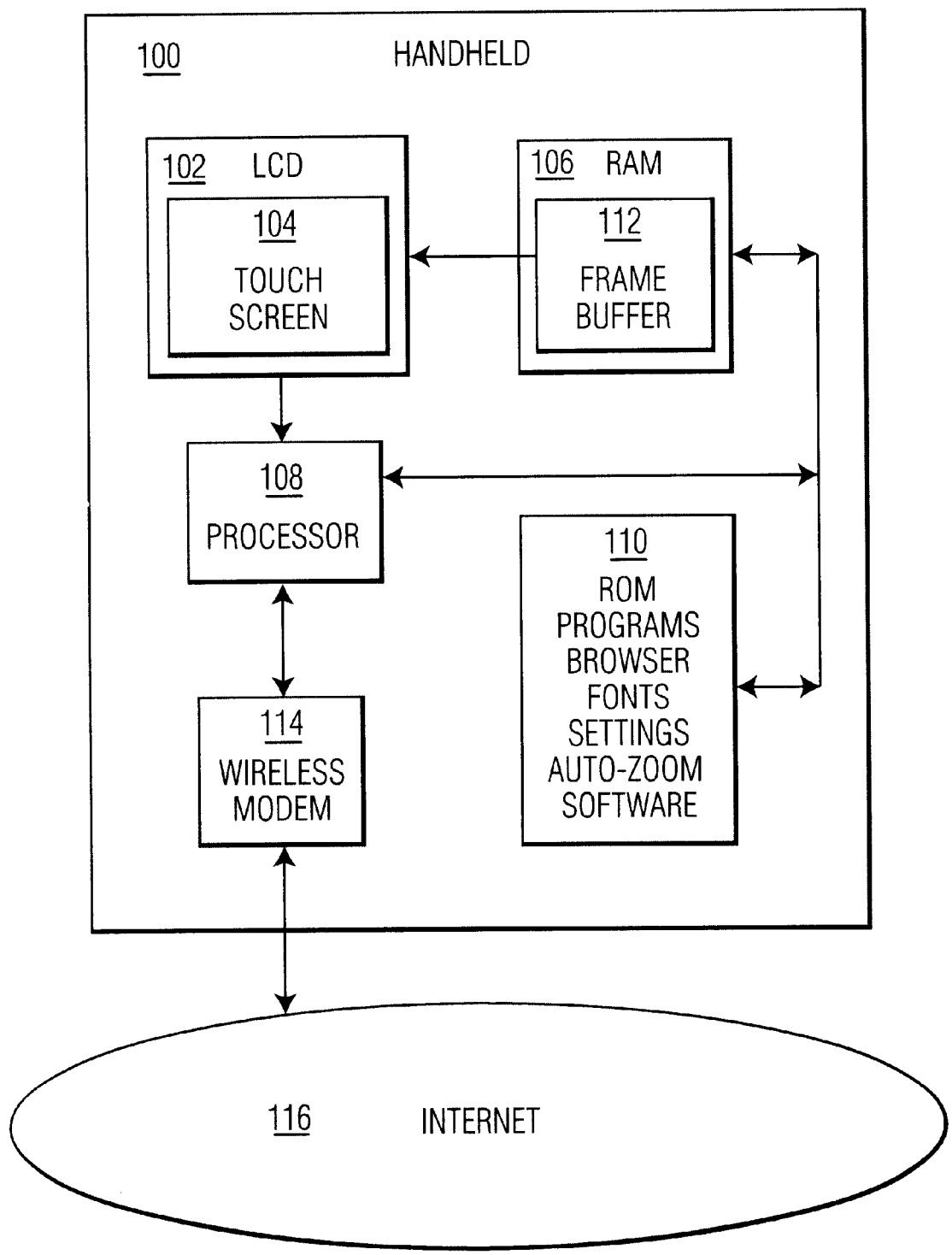

As specified above, the invention relates to, among other things, extending the autozoom keyboard idea in U.S. Ser. No. 09/062,364 to any kind of graphical or displayable information, when the information cannot be displayed in its entirety. For example, displaying a web page with hyperlinks on a mobile phone, which has a small LCD with touch screen functionality, may render the user-interaction with the links cumbersome if possible at all, due to their size. The LCD can nevertheless display the web page in its entirety by scaling it down. This initial rendering upon retrieval of the page from the Internet may very well cause the page illegible. However, proper filtering of the scaled down image ensures that the user can still recognize screen areas of potential interest and the hyperlinks therein. When the user touches the screen, the portion of the image underneath the touched location is enlarged and displayed so that hyperlinks can be individually be selected, possibly after a next, similar zoom-in process.

FIG. 1 is a block diagram with main components of an apparatus 100 in the invention. Apparatus 100 is, for example, a mobile phone or a palmtop PC with Internet access. Apparatus 100 comprises a display 102 for display of a graphical information, and a touch screen 104 for user-interaction with the apparatus. Display 102 comprises, e.g., an LCD. Touch screen 104 is, for example, a resistive tablet. For more background on such input devices, see, for example, U.S. Pat. Nos. 5,402,151; 5,231,381; 5,777,607 and 5,767,458 of Philips Electronics, all incorporated herein by reference. LCD 102 and touch screen 104 are physically integrated. Apparatus 100 comprises a random-access memory 106, a microprocessor 108, and a program memory 110 (e., an EEPROM). A portion of memory 106 comprises a frame buffer 112. Frame buffer 112 is coupled to display 102 and stores the information content shown on display 102. Memory 106 stores bitmaps that are mapped onto display 102 via frame buffer 106 under control of a software bit-blitter run on microprocessor 108. Microprocessor 108 receives user-input via touch screen 104 and translates the input into associated GUI actions via frame buffer 112 under control of the program memory 110. Handheld 100 comprises a wireless modem 114 for connecting to Internet 116. Program memory 110 stores, among other things, a browser application for enabling the user to navigate the Web, and the software for processing the graphical data as explained herein.

When the user has retrieved a web page via modem 114 the page gets displayed on LCD 102 in its entirety. Due to the scale size of LCD 102 individual hyperlinks or text fragments may not be well discernible, although the lay-out of the page conveys sufficient information to the user to determine what portion of the page may be relevant. Assume that the portion is the upper right hand corner of the page. When the user now touches screen 104 in the associated location or area, this action gets translated by processor 108 and under control of program memory 110 into a zooming-in on that part of the page image that is centered around the touch location. This can be implemented, e.g., by a predetermined segmentation of the display area into, say, four areas that each can be selected for the zooming-in. Alternatively, that part of the original image gets magnified that has a center coinciding with the touch location.

User-interaction with touch screen 104 causes display 102 to undergo a change in appearance. The change is preferably effected through animation. Animation is the simulation of movement created by displaying a series of pictures, or frames, e.g., bitmaps. For example, an image of the original page gradually develops in the zoomed in version of the area selected. Through the animation, the user perceives the development from one image to the other as a continuous transition. The impression is created of a gradually changing lay-out. Thus, the animation avoids the impression of an abrupt confrontation with a new lay-out that requires the user to re-orientate him/herself. The animation is effected through proper processing of the bitmaps in memory 106 and frame buffer 112.

Incorporated by reference herein are the following:

U.S. Ser. No. 09/062,364 (attorney docket PHA 23,387) filed Apr. 17, 1998 for Sung Choi and Jan van Ee for GRAPHICAL USER INTERFACE TOUCH SCREEN WITH AUTO ZOOM FEATURE. This document relates to a graphical user interface touch screen for displaying controllable functions of an electronic device. The function is displayed as an icon and at a scale size in which the function is recognizable by a user but too small to easily access features of the function. A magnified version of at least an area of the icon is provided upon the user touching the area of the icon.

U.S. Ser. No. 09/128,839 (attorney docket PHA 23,469) filed Aug. 4, 1998 for Jan van Ee for REMOTE CONTROL HAS ANIMATED GUI. This document relates to a remote control device for remote control of equipment such as a home theater. The remote has a display for display of a GUI that enables a user to interact with the device. User-interaction with the device causes the GUI to undergo a change in appearance. The change is effected through animation. Animation is the simulation of movement created by displaying a series of pictures, or frames, e.g., bitmaps. For example, a panel with clustered control options slides out of view and a next one slides into view, or displayed icons slide to new positions while new icons appear, etc. Through the animation, the user perceives the development from one panel to the other as a continuous transition. The impression is created of a gradually changing lay-out, of scrolling panels, of sliding, rotating, expanding or contracting icons, etc. Thus, the animation avoids the impression of an abrupt confrontation with a new lay-out.

U.S. Ser. No. 09/427,821 (attorney docket PHA 23,786) filed Oct. 27, 1999 for Joost Kemink and Richard Sagar for PDA HAS WIRELESS MODEM FOR REMOTE CONTROL VIA THE INTERNET. This document relates to a PDA combined with a wireless modem to enable remote control of CE equipment via the Internet and a local home server. More specifically, The wireless modem enables communication with a server via a data network such as the Internet. A control network is coupled between the server and controllable equipment. The handheld is now capable of functioning as a wireless remote control device for the equipment via the Internet and the server. The system may comprise a video camera together with hardware and software to create a formatted still image suitable for being displayed on the handheld device. The user can now instruct retrieval of a still image from the server via the Internet. This application serves as, e.g., a security system that enables the remote user to monitor his/her front porch, or to monitor a child by way of a remote (or fall-back) baby-sit. The user-accessibility of equipment is guaranteed by the ubiquity of the Internet, thus enabling to expand the range of control and monitoring capabilities for a mobile user.

What is claimed is:

1. A handheld communication device comprising:
    a wireless modem for receiving data;
    a display that has a substantially small size suitable for in the handheld communication device;
    a data processing system connected to the modem and to the display for processing the received data and for rendering an image corresponding to the data received;
    a touch screen for enabling a user to interact with the device;
    wherein:
    the system is operative to enable the user to select through a touch location on the touch screen a portion of the image, when displayed at a first scale, for rendering the selected portion on the display at a second scale larger than the first scale thereby facilitating a selection of a feature; and
    the selected portion when rendered at the first scale is a zoomed-in version of part of the image at the first scale substantially centered around the touch screen.

2. The device of claim 1, wherein a position of the touch location is arbitrary with respect to the touch screen.

3. The device of claim 1, comprising a browser.

4. The device of claim 1, having wireless Internet access.

5. The device of claim 1, wherein the data comprises streaming video.

6. Software for being installed on a handheld communication device comprising:
    a wireless modem for receiving data;
    a display that has a substantially small size suitable for in the handheld communication device;
    a data processing system connected to the input and to the display for processing the received data and for rendering an image corresponding to the data received;
    a touch screen for enabling a user to interact with the device;
    wherein:
    the software is operative to enable the user to select through a touch location on the touch screen a portion of the image, when displayed at a first scale, for rendering the selected portion on the display at a second scale larger than the "first scale;" and, thereby facilitating a selection of a feature,
    the selected portion when rendered at the first scale is a zoomed-in version of part of the image at the first scale substantially centered around the touch screen.

* * * * *